United States Patent
ElSayed et al.

(10) Patent No.: US 12,199,642 B2
(45) Date of Patent: Jan. 14, 2025

(54) HUFFMAN PACKING FOR DELTA COMPRESSION

(71) Applicant: ATI Technologies ULC, Markham (CA)

(72) Inventors: Yaser ElSayed, Pickering (CA); Angel Serah, Mississauga (CA); Jing Xie, Richmond Hill (CA)

(73) Assignee: ATI Technologies ULC, Markham (CA)

( * ) Notice: Subject to any disclaimer, the term of this patent is extended or adjusted under 35 U.S.C. 154(b) by 56 days.

(21) Appl. No.: 17/850,546

(22) Filed: Jun. 27, 2022

(65) Prior Publication Data
US 2023/0421173 A1 Dec. 28, 2023

(51) Int. Cl.
*H03M 7/40* (2006.01)
*H03M 7/30* (2006.01)
*H03M 7/32* (2006.01)

(52) U.S. Cl.
CPC ....... *H03M 7/3015* (2013.01); *H03M 7/4037* (2013.01); *H03M 7/6011* (2013.01)

(58) Field of Classification Search
CPC ........ H03M 7/42; H03M 7/30; H03M 7/3084; H03M 7/40; H03M 1/1205; H03M 1/1235; H03M 1/127; H03M 7/3086; H03M 7/3088; H03M 7/4012; H03M 7/405; H03M 7/4062; H03M 7/46; H03M 7/6029; H04N 19/507; H04N 19/593; H04N 19/503; H04N 19/61; H04N 1/648; H04N 11/042; H04N 19/124; H04N 19/126; H04N 19/13; H04N 19/156; H04N 19/157; H04N 19/162; H04N 19/17; H04N 19/176; H04N 19/18; H04N 19/186; H04N 19/40; H04N 19/42; H04N 19/423; H04N 19/46; H04N 19/48; H04N 19/60; H04N 19/85; H04N 19/90; H04N 19/91; H04N 23/665; H04N 25/46; H04N 25/74; H04N 25/77; G06T 9/001; G06T 9/004
USPC ......................................... 341/60, 65, 67, 59
See application file for complete search history.

(56) References Cited

U.S. PATENT DOCUMENTS

| | | | | |
|---|---|---|---|---|
| 5,260,693 | A * | 11/1993 | Horsley | H04N 19/593 341/63 |
| 5,448,642 | A * | 9/1995 | Yeh | H03M 7/30 382/232 |
| 5,675,382 | A * | 10/1997 | Bauchspies | H04N 1/648 358/1.9 |
| 5,699,445 | A * | 12/1997 | Wagner | G06T 1/0007 382/232 |
| 6,307,971 | B1 * | 10/2001 | Persiantsev | H04N 19/63 375/E7.255 |
| 6,360,017 | B1 * | 3/2002 | Chiu | H04N 19/51 375/E7.224 |
| 6,631,161 | B1 * | 10/2003 | Kajiki | H04N 19/176 375/E7.184 |

(Continued)

*Primary Examiner* — Linh V Nguyen
(74) *Attorney, Agent, or Firm* — FIG. 1 Patents

(57) ABSTRACT

Huffman packing for delta compression is described. In accordance with the described techniques, delta values between neighboring elements of a data block are generated using delta compression. The delta values are transformed according to a transformation algorithm. The transformed delta values are packed using Huffman encoding to generate compressed data that corresponds to the data block.

20 Claims, 7 Drawing Sheets

(56) References Cited

U.S. PATENT DOCUMENTS

| | | | | |
|---|---|---|---|---|
| 6,690,306 B1* | 2/2004 | Acharya | ................. | H03M 7/40 |
| | | | | 341/67 |
| 6,694,061 B1* | 2/2004 | Acharya | ................. | G06T 9/004 |
| | | | | 382/238 |
| 6,694,067 B1* | 2/2004 | O'Keefe | ............ | G02B 6/02033 |
| | | | | 385/12 |
| 6,765,962 B1* | 7/2004 | Lee | ...................... | H04N 19/124 |
| | | | | 375/240.03 |
| 7,548,658 B1* | 6/2009 | Rudin | .................... | H04N 19/91 |
| | | | | 375/240.18 |
| 8,666,186 B1* | 3/2014 | Rasche | ................. | G06V 10/30 |
| | | | | 382/244 |
| 8,872,930 B1* | 10/2014 | Linzer | .................. | H04N 19/186 |
| | | | | 348/222.1 |
| 2003/0123538 A1* | 7/2003 | Krause | ................. | H04N 19/503 |
| | | | | 375/E7.129 |
| 2005/0207408 A1* | 9/2005 | Elliott | .................... | H04L 69/04 |
| | | | | 370/389 |
| 2009/0313238 A1* | 12/2009 | Merrigan | ............... | G06F 16/316 |
| | | | | 707/999.005 |
| 2016/0028985 A1* | 1/2016 | Vogelsang | ........ | H01L 27/14634 |
| | | | | 348/294 |
| 2017/0310979 A1* | 10/2017 | Shaw | ................. | H04N 19/182 |
| 2018/0020232 A1* | 1/2018 | Saeedi | ................. | H04N 19/186 |
| 2019/0140658 A1* | 5/2019 | Cooper | ............... | H03M 7/3084 |

* cited by examiner

HUFFMAN PACKING FOR DELTA COMPRESSION

BACKGROUND

Delta compression is utilized in a variety of different scenarios, including to compress data stored in a cache in order to reduce memory bandwidth. To compress an image using delta compression, for example, differences between neighboring pixels of the image are determined and data corresponding to these differences is generated. This takes advantage of the observation that in images (and various other types of data) differences (i.e., the deltas) between many neighboring elements (e.g., pixels) are often relatively small, as compared to values of the elements themselves. For instance, between neighboring pixels of an image that both correspond to a portion of the sky (e.g., both blue), the difference in the values may be relatively small, if there is any difference. Indeed, portions of such images often include groups of neighboring pixels having the same color. Despite the small difference in pixel values, one neighboring pixel to another, the pixel value of a first pixel in the sky and the pixel value of a second neighboring pixel in the sky are generally larger (require more bits to represent) than the values representing the differences between the neighboring values.

BRIEF DESCRIPTION OF THE DRAWINGS

The detailed description is described with reference to the accompanying figures.

DETAILED DESCRIPTION

Overview

Figure 1:
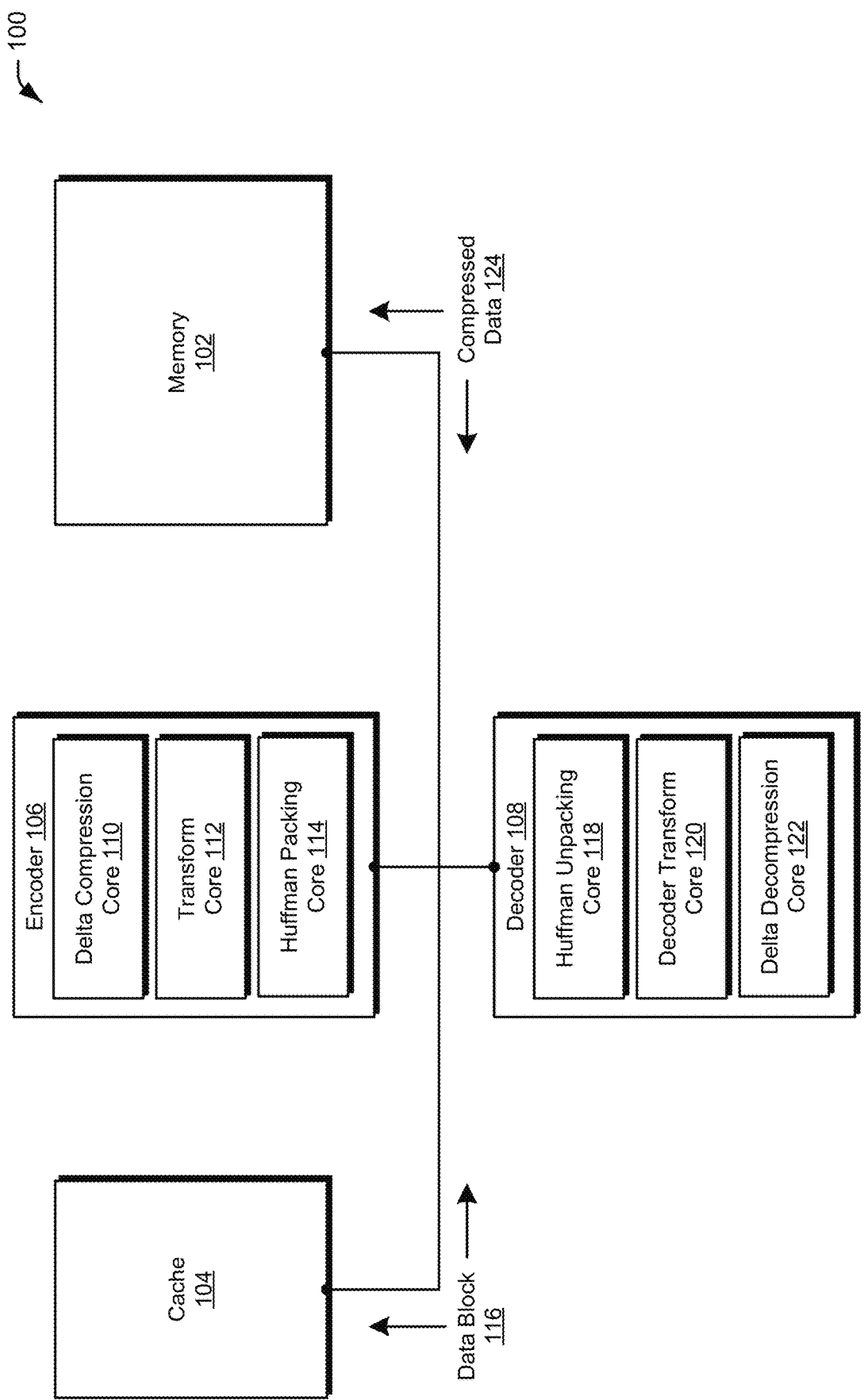
FIG. 1 is a block diagram of a non-limiting example system having a memory, a cache, and an encoder that compresses data blocks using delta compression and by transforming delta values for packing.

Delta compression, such as delta color compression, typically compresses data in two stages. In a first stage, delta values between neighboring elements (e.g., between neighboring pixels) are determined, and in a second stage the generated delta values are packed. Conventional delta compression systems often utilize packing algorithms which pad the delta values with extra 0's in order to achieve alignments, but doing so is inefficient. Thus, to improve the efficiency of the packing stage and to achieve better compression performance, the described techniques utilize Huffman encoding in the packing stage of delta compression.

Huffman encoding utilizes a search table for decoding in order to generate the original delta value. For an 8-bit delta value, however, a search table of 256 entries is needed in order to generate the original 8-bit delta value which is costly in terms of memory bandwidth and power usage. Thus, the described techniques further improve the efficiency of conventional delta compression systems by including a transformation stage prior to the packing stage. In the transformation stage, the delta values are transformed using a transformation algorithm prior to packing the transformed delta values using Huffman encoding. Notably, the transformation algorithm reduces the search table needed to decode 8-bit delta values packed using Huffman encoding from 256 entries to just 16 entries, which greatly improves the efficiency of the described delta compression techniques.

In some aspects, the techniques described herein relate to a method including: generating delta values between neighboring elements of a data block using delta compression, transforming the delta values according to a transformation algorithm, and packing the transformed delta values using Huffman encoding to generate compressed data that corresponds to the data block.

In some aspects, the techniques described herein relate to a method, wherein each of the delta values represents a difference between neighboring elements of the data block.

In some aspects, the techniques described herein relate to a method, wherein transforming the delta values is based on whether a respective delta value is positive or negative.

In some aspects, the techniques described herein relate to a method, wherein a sign bit of a respective delta value indicates whether the respective delta value is positive or negative.

In some aspects, the techniques described herein relate to a method, wherein the sign bit is positioned at a leftmost bit location of the respective delta value, and wherein transforming the respective delta value moves the sign bit from the leftmost bit location to a different bit location of a transformed delta value.

In some aspects, the techniques described herein relate to a method, wherein transforming the delta values shifts at least a subset of bits of the respective delta value of a transformed delta value.

In some aspects, the techniques described herein relate to a method, wherein transforming the delta values flips bits other than the sign bit of the respective delta value if the respective delta value is negative.

In some aspects, the techniques described herein relate to a method, wherein each of the delta values is an 8-bit string, and wherein transforming the delta values divides the 8-bit string of each of the delta values into two 4-bit strings.

In some aspects, the techniques described herein relate to a method, wherein packing the transformed delta values using Huffman encoding is based on a frequency of the 4-bit strings of the transformed delta values.

In some aspects, the techniques described herein relate to a method including: generating delta values between neighboring elements of a data block using delta compression, and prior to packing the delta values transforming the delta values by: determining, for each delta value, whether the delta value is positive or negative based on a sign bit of the delta value, if the delta value is negative, moving the sign bit of the delta value to a different bit location, flipping other bits of the delta value, and shifting a subset of the bits of the delta value, or if the delta value is positive, moving the sign bit of the delta value to the different bit location and shifting the subset of the bits of the delta value without flipping the other bits of the delta value.

In some aspects, the techniques described herein relate to a method, further including packing the transformed delta values using Huffman encoding to generate compressed data that corresponds to the data block.

In some aspects, the techniques described herein relate to a method, wherein the delta compression includes delta color compression.

In some aspects, the techniques described herein relate to a method, wherein each of the delta values are 8 bits and include a bit 0 location, a bit 1 location, a bit 2 location, a bit 3 location, a bit 4 location, a bit 5 location, a bit 6 location, a bit 7 location, and wherein the sign bit is positioned at the bit 7 location, and wherein transforming the delta values includes moving the sign bit of each of the delta values from the bit 7 location to the bit 4 location.

In some aspects, the techniques described herein relate to a method, wherein shifting the subset of the bits of the delta value includes shifting the bit location 4, the bit location 5, and the bit location 6 to the bit location 5, the bit location 6, and the bit location 7, respectively.

In some aspects, the techniques described herein relate to a system including: a delta compression core to generate delta values between neighboring elements of a data block, a transform core to transform each of the delta values, and a Huffman packing core to pack the transformed delta values using Huffman encoding to generate compressed data that corresponds to the data block.

In some aspects, the techniques described herein relate to a system, further including a decoder to decompress the compressed data.

In some aspects, the techniques described herein relate to a system, wherein each of the delta values represents a difference between neighboring elements of the data block.

In some aspects, the techniques described herein relate to a system, wherein the transform core transforms each of the delta values based on a sign bit of the delta value, wherein the sign bit of the delta value indicates whether the delta value is positive or negative.

In some aspects, the techniques described herein relate to a system, wherein each of the delta values is an 8-bit string, and wherein the transform core divides the 8-bit string of each of the delta values into two 4-bit strings.

In some aspects, the techniques described herein relate to a system, wherein the Huffman packing core encodes each of the 4-bit strings with a symbol from a limited set of symbols, wherein the symbol is selected based on a frequency of the 4-bit strings of the transformed delta values.

FIG. 1 is a block diagram of a non-limiting example system 100 having a memory, a cache, and an encoder that compresses data blocks using delta compression and transforming delta values for packing. In particular, the system includes memory 102, cache 104, encoder 106, and decoder 108. In this example, the encoder 106 includes delta compression core 110, transform core 112, and Huffman packing core 114. To decode data blocks 116 compressed by the encoder 106, in accordance with the described techniques, the decoder 108 includes Huffman unpacking core 118, decoder transform core 120, and delta decompression core 122.

In one or more implementations, the memory 102, the cache 104, the encoder 106, and/or the decoder 108 are coupled to one another via a wired or wireless connection. Example wired connections include, but are not limited to, buses connecting two or more of the memory 102, the cache 104, the encoder 106, and/or the decoder 108. Examples of devices in which the system 100 is implemented include, but are not limited to, servers, personal computers, laptops, desktops, game consoles, set top boxes, tablets, smartphones, mobile devices, virtual and/or augmented reality devices, wearables, medical devices, systems on chips, and other computing devices or systems.

The memory 102 is a device or system that is used to store information, such as for immediate use in a device, e.g., by a processor. In one or more implementations, the memory 102 corresponds to semiconductor memory where data is stored within memory cells on one or more integrated circuits. In at least one example, the memory 102 corresponds to or includes volatile memory, examples of which include random-access memory (RAM), dynamic random-access memory (DRAM), synchronous dynamic random-access memory (SDRAM), and static random-access memory (SRAM). Alternatively or in addition, the memory 102 corresponds to or includes non-volatile memory, examples of which include flash memory, read-only memory (ROM), programmable read-only memory (PROM), erasable programmable read-only memory (EPROM), and electronically erasable programmable read-only memory (EEPROM). The memory 102 is configurable in a variety of ways that support compressing data blocks using delta compression and transforming delta values for packing without departing from the spirit or scope of the described techniques.

The cache 104 is a hardware or software component that stores data (e.g., at least temporarily) so that a future request for the data is served faster from the cache 104 than from the memory 102. In one or more implementations, the cache 104 is at least one of smaller than the memory 102, faster at serving data to a cache client (e.g., a processor) than the memory 102, or more efficient at serving data to the cache client than the memory 102. Additionally or alternatively, the cache 104 is located closer to the cache client than is the memory 102. It is to be appreciated that in various implementations the cache 104 has additional or different characteristics which make serving at least some data to a cache client (e.g., a processor) from the cache 104 advantageous over serving such data from the memory 102.

In accordance with the described techniques, the encoder 106 compresses one or more data blocks 116 to generate compressed data 124. In one or more implementations, the delta compression core 110, the transform core 112, and the Huffman packing core 114 are intellectual property (IP) cores, examples of which include a reusable unit of logic, cell, or integrated circuit layout design integrated into, for instance, application-specific integrated circuits (ASIC) and systems of field-programmable gate array (FPGA) logic. Similarly, the Huffman unpacking core 118, the decoder transform core 120, and the delta decompression core 122 are implemented as IP cores in one or more variations. Notably, the delta compression core 110, the transform core 112, and the Huffman packing core 114 of the encoder 106 and the Huffman unpacking core 118, the decoder transform core 120, and the delta decompression core 122 of the decoder 108 are implementable in a variety of ways without departing from the spirit or scope of the described techniques. In the context of producing compressed data 124 by compressing a data block 116, consider the following discussion of FIG. 2.

Figure 2:
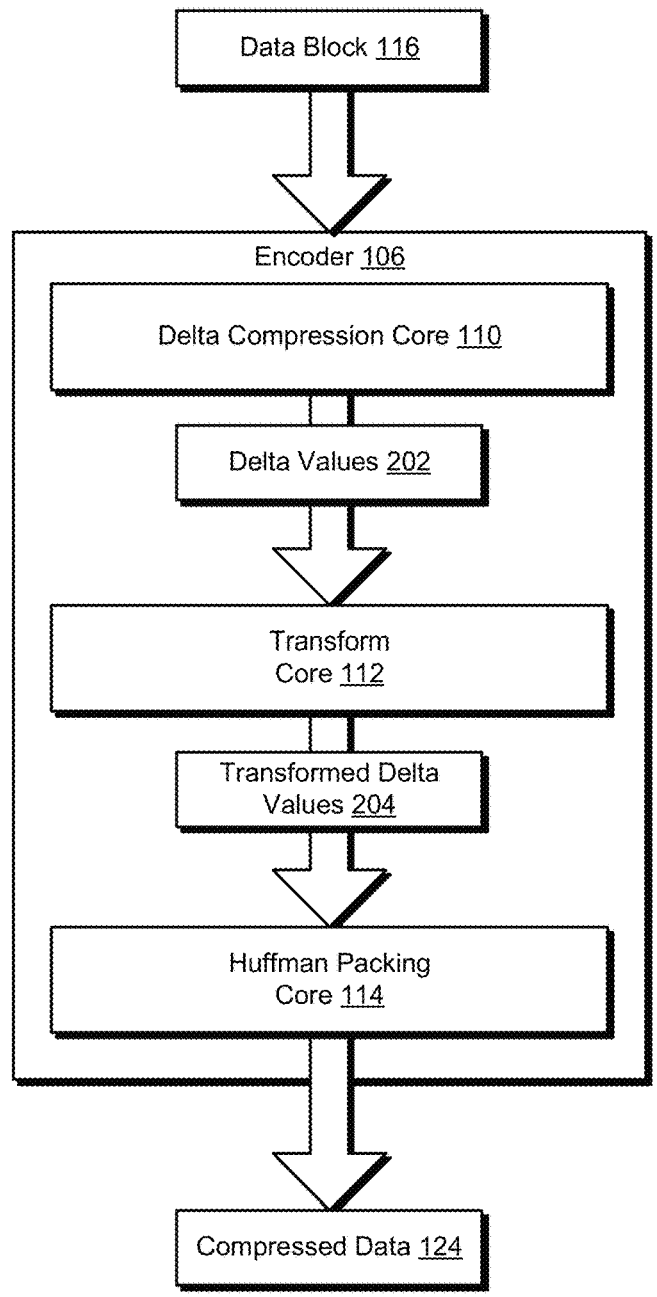
FIG. 2 depicts a non-limiting example of the encoder that compresses data blocks using delta compression and by transforming the delta values for packing.

FIG. 2 depicts a non-limiting example 200 of the encoder that compresses data blocks using delta compression and by transforming the delta values for packing. In the example 200, the encoder 106 is depicted compressing the data block 116 to produce the compressed data 124.

Broadly, the encoder 106 receives the data block 116 as input. The encoder 106 is configured to receive data blocks 116 that correspond to various types of information having multiple elements of data. Examples of the data block 116 include, by way of example and not limitation, images or portions thereof (e.g., where "elements" of the data block are pixels), weather data elements, financial data elements, cryptographic elements, scientific data elements, traffic data elements, health data elements, and groupings of other data elements, such as data elements processed by machine learning models, to name just a few.

In accordance with the described techniques, the delta compression core 110 generates delta values 202 between neighboring elements of the data block 116 using one or more delta compression techniques. The transform core 112 transforms the delta values 202 according to a transform algorithm and outputs transformed delta values 204. At a packing stage of the compression, the Huffman packing core 114 packs the transformed delta values 204 using Huffman encoding. Details of one example delta compression technique (i.e., delta color compression), a transform algorithm, and packing using Huffman encoding are discussed in more detail below.

To generate the delta values 202, the delta compression core 110 determines differences between neighboring elements of the data block 116. In an example where the data block 116 is an image, for instance, the delta compression core 110 determines differences between neighboring pixels of the image and generates data corresponding to those differences. This takes advantage of the observation that in images (and various other types of data) differences (i.e., the deltas) between many neighboring elements (e.g., pixels) are often relatively small, as compared to values of the elements themselves. For instance, between neighboring pixels of an image that both correspond to a portion of the sky (e.g., both blue), the difference in the values may be relatively small, if there is any difference. Indeed, portions of such images often include groups of neighboring pixels having the same color. Despite the small difference in pixel values, one neighboring pixel to another, the pixel value of a first pixel in the sky and the pixel value of a second neighboring pixel in the sky are generally larger (require more bits to represent) than the values representing the differences between the neighboring values (e.g., the delta values).

Determining the delta values 202 between neighboring elements of a data block 116 takes advantage of this observation. In variations, the delta compression core 110 generates the delta values 202 according to different techniques (e.g., algorithms) for determining the deltas between neighboring elements of a data block 116 without departing from the spirit or scope of the described techniques. In at least one implementation, though, the delta compression core 110 determines the delta values 202 using delta color compression, an example of which is discussed in more detail in relation to FIGS. 3-4.

Figure 3:
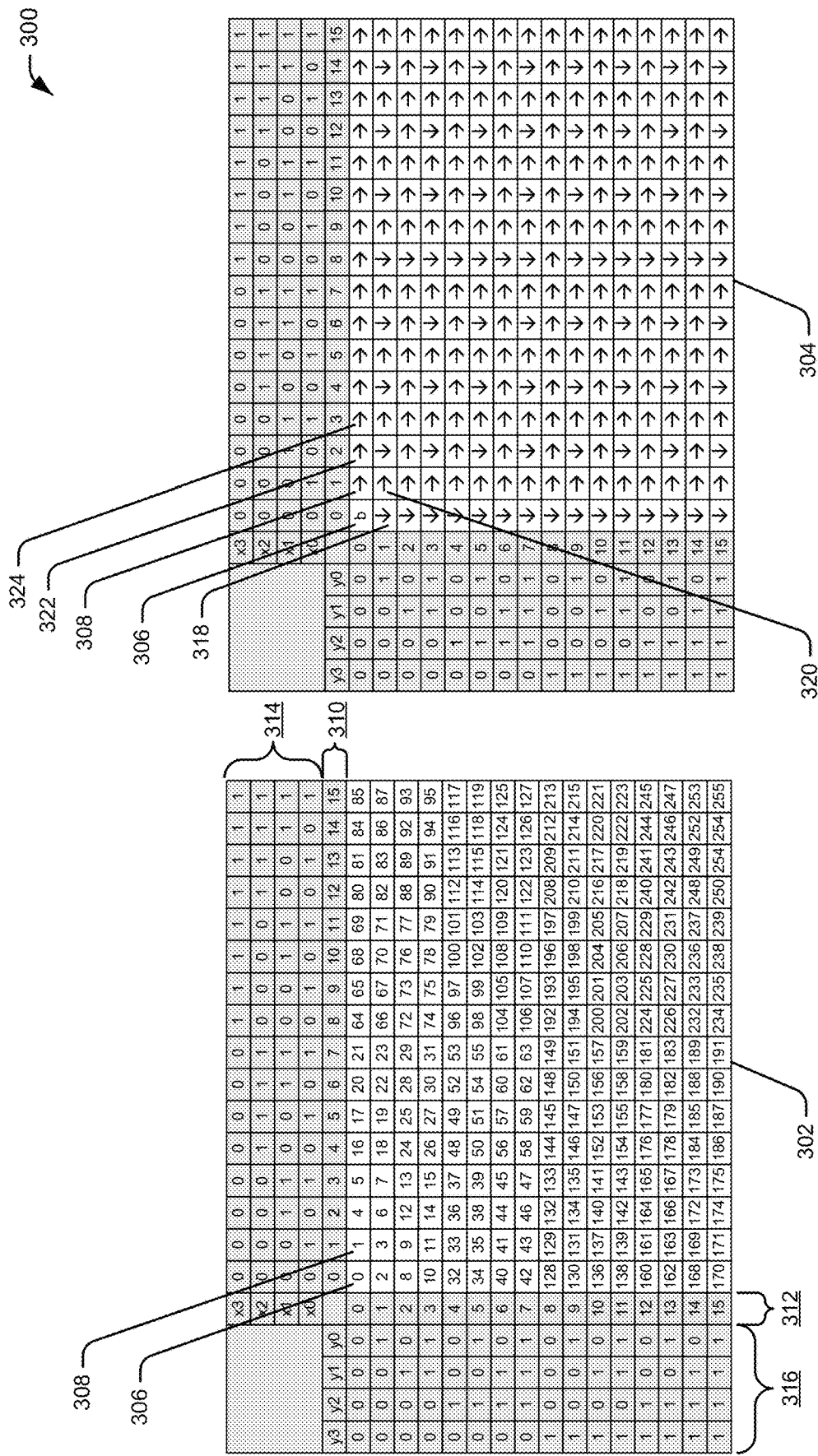
FIG. 3 depicts a non-limiting example of tables associated with one example of a delta compression algorithm.

FIG. 3 depicts a non-limiting example 300 of tables associated with one example of a delta compression algorithm. In particular, the example 300 includes a first table 302 and a second table 304.

The first table 302 includes identifiers (e.g., element numbers) of elements of a data block, e.g., pixels of an image. In particular, the first table 302 includes unique numerical identifiers (0-255). In the first table 302, each identifier corresponds to an individual element, and the multiple elements, together, form a data block 116 (or a portion of a data block 116). The first table 302 also specifies positions of the elements. For instance, the first table 302 specifies the position of each element in coordinate space (e.g., using x-coordinates and y-coordinates), such that each element has a unique combination of x- and y-coordinates. By way of example, element 306, with the identifier '0', has a position of (0, 0) in the illustrated example 300. Accordingly, the x-coordinate of the element 306 is '0' and the y-coordinate of the element 306 is also '0.' By way of contrast, element 308, with the identifier '1', has a position of (1,0) in the illustrated example 300. Accordingly, the x-coordinate of the element 306 is '1' and the y-coordinate of the element 306 is '0.'

In addition to decimal representations of the x- and y-coordinates 310, 312, respectively, the first table 302 also includes binary representations of the x- and y-coordinates, 314, 316, respectively. In one or more implementations, the delta color compression is limited to representing coordinates of elements using four bits, as depicted in the example 300, e.g., a first four bits to represent each x-coordinate and a second four bits to represent each y-coordinate. This limits a number of elements to 256, e.g., the number of elements packed together. Accordingly, in one or more implementations, the delta compression core 110 determines the delta values 202 for groups of 256 elements. In operation, various data blocks 116 (e.g., images) include more than 256 elements (e.g., more than 256 pixels). Accordingly, data blocks having more than 256 elements are divided by the delta compression core 110, and/or by some other logic (not shown), prior to determination of the delta values 202. Although coordinate space is discussed above and below for the sake of convenience, in variations and for the purpose of determining neighboring elements, positions of elements are indicated in other ways without departing from the spirit or scope of the described techniques, such as by using vectors of elements in vector space.

The second table 304 indicates which of the elements identified by the identifiers (0-255) in the first table 302 are neighboring elements, such that the delta values between neighboring elements (e.g., a pair of two elements) is determinable. Like the first table 302, the second table 304 also includes decimal representations and 4-bit binary representations of x- and y-coordinates of the elements represented by the tables 302, 304. Rather than include identifiers of the elements (e.g., the numerical values 0-255), the second table 304 includes indications (e.g., arrows) of each element's neighboring element.

In accordance with one or more delta compression techniques, at least one element in a data block of elements corresponds to a reference element for generating an encoding of the data block. When encoding (e.g., compressing) a data block, a value of the reference element is often fully included in the compressed data, while the values included in the compressed data for the other elements correspond to the delta values determined for those other elements. With the continuing example of encoding (e.g., compressing) an image, for instance, the encoded (e.g., compressed) data includes a pixel value of a reference pixel but includes delta values for the other pixels in the data block.

In the illustrated example 300, the element 306 corresponds to the reference element of the data block, e.g., the data block being compressed. Rather than including an identifier of the element 306, as in the first table 302, the second table 304 includes an indication that the element 306 is a base or reference element, which enables delta values for the other elements to be computed and maintained in association with the reference element. This enables the values of the other elements to be determined. For instance, the value of the element 308 is determinable based on the value of the element 306 and the difference between the element 306 and the element 308 (e.g., the delta value between those elements).

In delta color compression, specifically, the second table 304 heuristically identifies the neighboring element from which element's delta values is determined (e.g., using the arrows), with the exception of the reference element since its actual value is maintained in the encoding. In one or more implementations, for instance, the delta value 202 computed for the element 308 (having the identifier '1') is computed as the difference between the element 308 and the element 306, the delta value 202 computed for element 318 (having the identifier '2') is computed as the difference between the element 306 and the element 318, the delta value 202 computed for element 320 (having the identifier '3') is computed as the difference between the element 318 and the element 320, the delta value 202 computed for the element 322 (having the identifier '4') is computed as the difference between the element 308 and the element 320, the delta value 202 computed for the element 324 (having the identifier '5') is computed as the difference between the element 320 and the element 322, and so on.

These neighboring relationships are depicted in the second table 304 as arrows. In variations, neighboring relationships used for delta compression are maintained in a table (or other information) and are specified in such a table (or the other information) in various ways without departing from the spirit or scope of the described techniques. As noted above, although delta color compression is discussed herein, in one or more variations, other delta compression techniques for computing the delta values 202 between elements in the data block 116 are used without departing from the spirit or scope of the described techniques. In the context of designating a reference element and determining delta values for the other elements of a data block, consider the following example.

Figure 4:
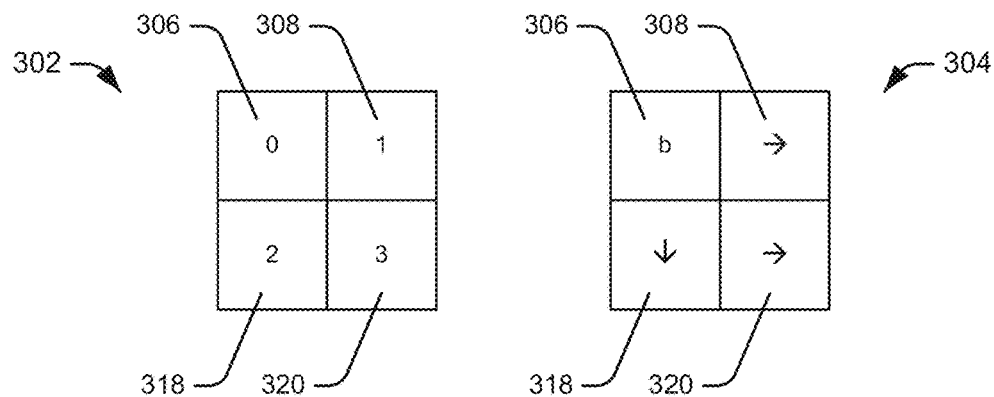
FIG. 4 depicts a non-limiting example of a portion of a data block and delta values computed according to a delta compression algorithm.
Figure 4:
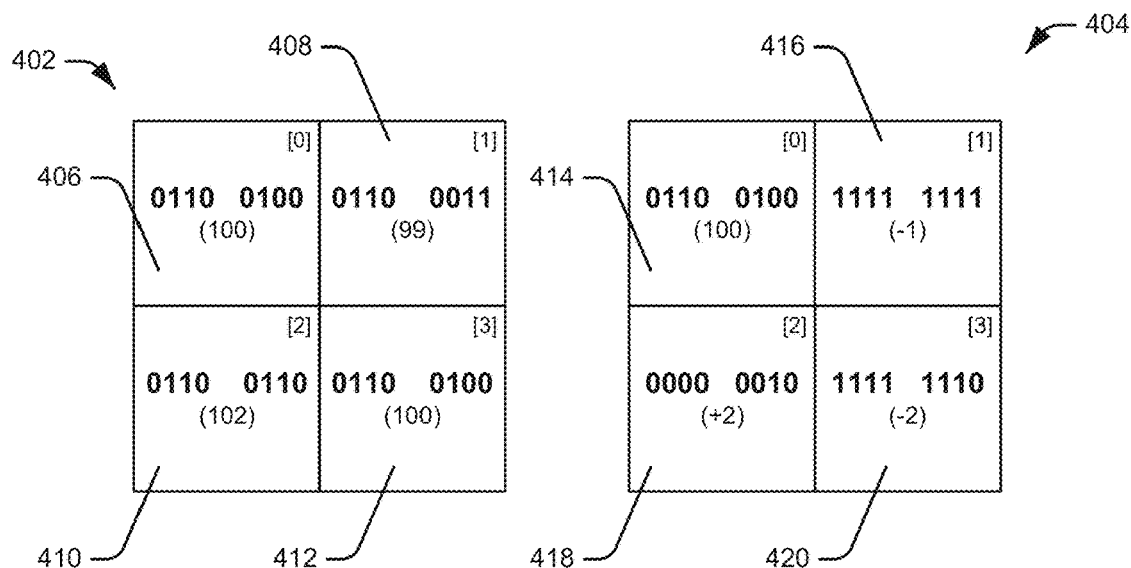

FIG. 4 depicts a non-limiting example 400 of a portion of a data block and delta values computed according to a delta compression algorithm.

The illustrated example 400 depicts a portion of the first table 302 and a portion of the second table 304. The depicted portions of those tables correspond to the elements 306, 308, 318, 320 of a data block 116. The illustrated example 400 also depicts a representation of a portion 402 of an example data block 116 and a representation of a portion 404 of the delta values 202 which correspond to the portion 402 of the example data block 116. The representation of the portion 402 further includes representations 406-412 of the elements 306, 308, 318, 320 of the data block 116. For the purpose of discussion, the representations 406-412 of the elements each include an indication of the element's identifier, a first indication of the element's value (in binary and using 8 bits), and a second indication of the element's value (in decimal).

In this example 400, the representation 406 corresponds to the element 306, the representation 408 corresponds to the element 308, the representation 410 corresponds to the element 318, and the representation 412 corresponds to the element 320. As depicted in the representations 406-412, in the example 400, the element 306 has a value of '100' (decimal), the element 308 has a value of '99' (decimal), the element 318 has a value of '102' (decimal), and the element 320 has a value of '100' (decimal). As noted, the representations 406-412 also depict the corresponding binary values (8-bit) of the elements 306, 308, 318, 320. In this example 400, for instance, the representation 406 depicts that the element 306 has a binary value of '0110 0100' (which corresponds to '100' in decimal), the representation 408 depicts that the element 308 has a binary value of '0110 0011' (which corresponds to '99' in decimal), the representation 410 depicts that the element 318 has a binary value of '0110 0110' (which corresponds to '102' in decimal), and the representation 412 depicts that the element 320 has a binary value of '0110 0100' (which corresponds to '100' in decimal).

The representation of the portion 404 of the delta values 202 further includes representations 414-420 of the delta values 202 computed (e.g., by the delta compression core 110) for the elements 306, 308, 318, 320 of the data block 116. For the purpose of discussion, the representations 414-420 of the computed delta values each include the indication of the element's identifier, a first indication of the computed delta value (the reference value used for the element 306) for the element (an 8-bit two's complement version of the value), and a second indication of the computed delta value for the element (in decimal). As noted above, delta compression techniques use a reference value so that the actual values of the elements are reproduceable from the reference value and one or more of the delta values 202. In the illustrated example 400 and in accordance with the delta color compression algorithm, the value for the element 306 represented in the portion 404 of the delta values 202 is the element 306's actual value, '100' (decimal) and '0110 0100' (8-bit two's complement version of the value), which is used as a reference value for the delta values 202. The values for the other elements represented in the portion 404 are the deltas between the element and the designated neighboring element, e.g., as designated by the second table 304.

As noted in the discussion of FIG. 3, and as depicted in the portion of the second table 304 in the example 400, the neighboring element of element 308 is element 306. Thus, the delta value 202 of element 308 is determined based on a difference with the element 306. The neighboring element of element 318 is also element 306. Thus, the delta value 202 of the element 318 is also determined based on a difference with the element 306. In accordance with the principles of delta color compression, the neighboring element of element 320 is element 318. Thus, the delta value 202 of the element 320 is determined based on a difference with the element 318. Based on these designations of neighboring elements and based on the element 306 corresponding to a reference value, the delta values 202 of the elements represented by the portion 402 of the data block 116 are determined for delta compression as follows.

The value used as the delta value 202 for the element 306 is '100' (decimal) and '0110 0100' (8-bit two's complement version of the value), which is indicated in the representation 414. The actual value of the element 306 is used because the element 306 is the reference element of the data block 116. The representation 416 depicts the value '−1' (signed decimal) and '1111 1111' (8-bit two's complement version of the signed integer −1), which is computed as the difference between the value of the element 308 and the value of the element 306, e.g., the change from value of the element 306 to the value of the element 308. In other words, the change from '100' (e.g., the value of the element 306) to '99' (e.g., the value of the element 308) is '−1'. Thus, the delta value 202 computed for the element 308 is '−1' in decimal and '1111 1111' in an 8-bit representation.

The representation 418 depicts the value '+2' (signed decimal) and '0000 0010' (8-bit two's complement version of the signed integer +2), which is computed as the difference between the value of the element 318 and the value of the element 306, e.g., the change from value of the element 306 to the value of the element 318. In other words, the change from '100' (e.g., the value of the element 306) to '102' (e.g., the value of the element 318) is '+2'. Thus, the delta value 202 computed for the element 318 is '+2' in decimal and '0000 0010' in an 8-bit representation.

The representation 420 depicts the value '−2' (signed decimal) and '1111 1110' (8-bit two's complement version of the signed integer −2), which is computed as the difference between the value of the element 320 and the value of the element 318, e.g., the change from value of the element 318 to the value of the element 320. In other words, the change from '102' (e.g., the value of the element 318) to '100' (e.g., the value of the element 320) is '−2'. Thus, the delta value 202 computed for the element 320 is '−2' in decimal and '1111 1110' in an 8-bit representation. Notably, the values included in FIG. 4 and discussed in relation thereto are merely examples, and the values of the elements of a data block for which the delta values 202 are computed differ in various implementations.

As mentioned above, the delta compression core 110 is configured to use various delta compression algorithms to determine the delta values 202 between elements of data blocks 116 without departing from the spirit or scope of the described techniques. Delta color compression is one example of such an algorithm. In the context of transforming the delta values for packing using Huffman encoding, consider the following discussion of FIG. 5. The following discussion includes example details about a transformation algorithm used by the transform core 112 in accordance with the described techniques.

Figure 5:
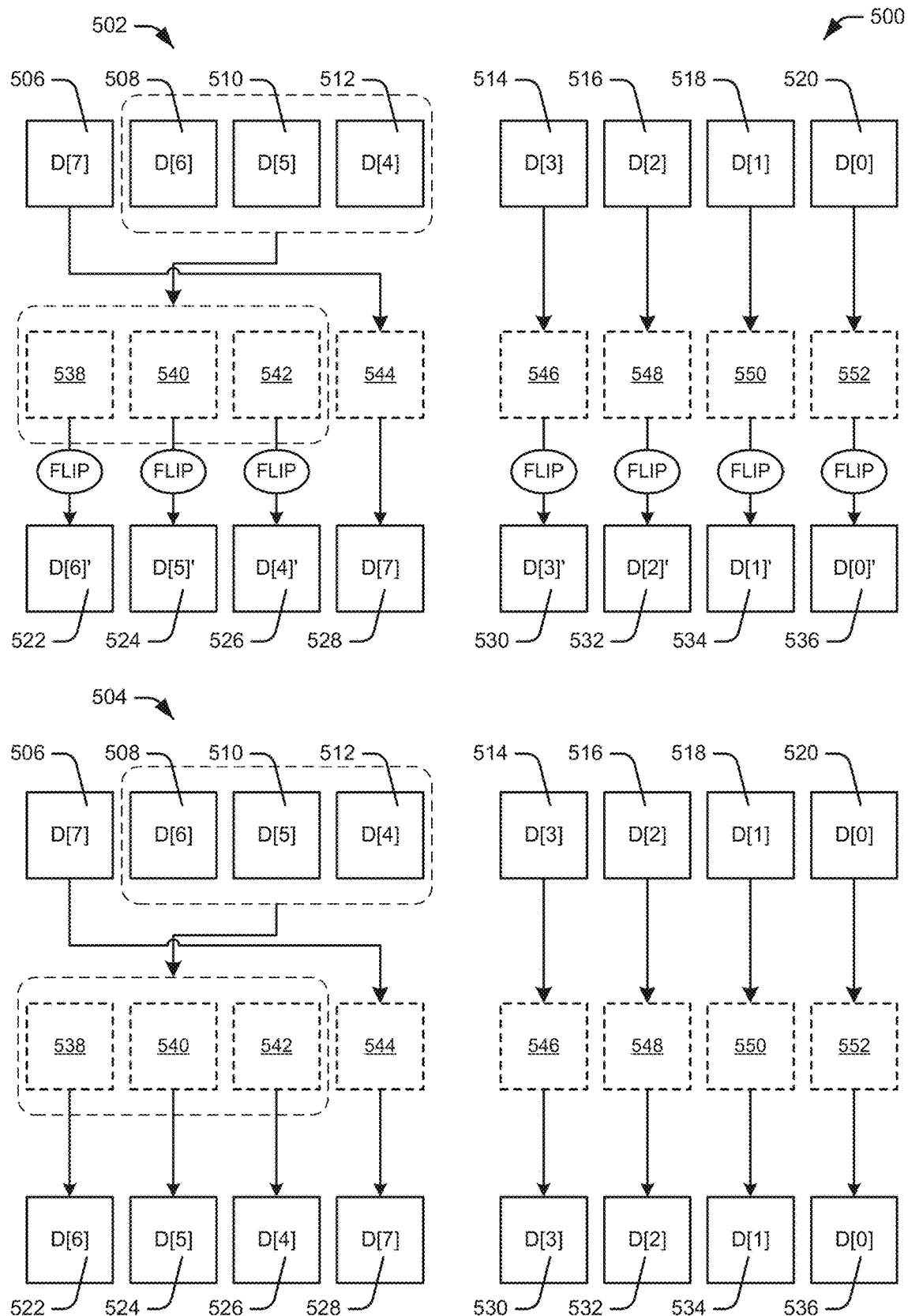
FIG. 5 depicts a non-limiting example of a transformation of a delta value to produce a transformed delta value for packing.

FIG. 5 depicts a non-limiting example 500 of a transformation of a delta value to produce a transformed delta value for packing.

In accordance with the described techniques, the transform core 112 transforms the delta values 202 according to a transform algorithm to produce the transformed delta values 204. In one or more implementations, for example, the transform core 112 transforms the delta values 202 using the transformation algorithm represented by the following pseudo code:

```
if (D[7]) // if the delta value is negative
{
    transformed_delta_value = (~D[6:4], D[7], ~D[3:0]);
}
else // the delta value is positive
{
    transformed_delta_value = (D[6:4], D[7], D[3:0]);
}
```

For the purpose of discussion, assume D[7] corresponds to a leftmost bit of the 8-bit delta values 202 discussed above, D[0] corresponds to a rightmost bit of the delta values 202 discussed above, and the bits of the delta values 202 are arranged as follows, left to right: D[7], D[6], D[5], D[4], D[3], D[2], D[1], and D[0]. In this example, the leftmost bit, D[7] corresponds to a "sign bit" which identifies whether the delta value 202 is positive or negative. If the sign bit located at D[7] has a value of "0", for example, then the delta value 202 is "positive", whereas if the sign bit located at D[7] has a value of "1", then the delta value 202 is "negative". Thus, for the 8-bit representation of the delta value +2, which is '0000 0010', the bit D[7] equals '0', the bit D[6] equals '0', the bit D[5] equals '0', the bit D[4] equals '0', the bit D[3] equals '0', the bit D[2] equals '0', the bit D[1] equals '1', and the bit D[0] equals '0'. For the 8-bit representation of the delta value −2, which is '1111 1110', the bit D[7] equals '1', the bit D[6] equals '1', the bit D[5] equals '1', the bit D[4] equals '1', the bit D[3] equals '1', the bit D[2] equals '1', the bit D[1] equals '1', and the bit D[0] equals '0'.

The sign bit is used by the transform core 112 to determine whether a delta value 202 is positive or negative. For instance, given the pseudo code above of the example transformation algorithm, the transform core 112 initially processes the sign bit, e.g., the leftmost bit positioned at D[7], of a delta value 202 to identify whether the delta value is positive or negative. When the representation of the delta value is a negative value and based on two's complement, as discussed in the example above, the leftmost bit of the bitstring is equal to '1'. Thus, when D[7] is equal to '1' the transform core 112 determines that the delta value 202 is negative. In contrast, when the sign bit positioned at D[7] is equal to '0' the transform core 112 determines that the delta value 202 is positive.

In one or more implementations, the operations that the transform core 112 performs in relation to the bits of negative delta values are different from the operations the transform core 112 performs in relation to the bits of positive delta values. In accordance with the algorithm specified above, for instance, the transform core 112 processes a delta value according to a first branch of the algorithm when the delta value is negative and processes a delta value according to a second branch of the algorithm when the delta value is positive.

In accordance with the above noted algorithm, when the transform core 112 detects a negative delta value, the transform core 112 generates a transformed delta value 204 by reordering one or more of the bits and also by flipping one or more specified bits. In particular, the transform core 112, shifts each of bits D[6:4] one location to the left, such that the bit D[6] of the delta value 202 is shifted to the leftmost location in the transformed delta value 204, the bit D[5] of the delta value 202 is shifted to the second leftmost location in the transformed delta value 204, and so forth. Further, the transform core 112 moves the sign bit from the leftmost bit location of the delta value to a different bit location. In one or more implementations, for instance, the transform core 112 inserts the sign bit D[7] after the bits D[6:4] and keeps the bits D[3:0] in the same locations as in the delta values. Thus, the transform core 112 reorders the bits from D[7], D[6], D[5], D[4], D[3], D[2], D[1], D[0] to D[6], D[5], D[4], D[7], D[3], D[2], D[1], D[0]. In addition to reordering the bits, when the transform core 112 detects a negative delta value 202, the transform core 112 flips the bits other than the sign bit, e.g., other than D[7]. Accordingly, the transform core 112 flips the bits D[6], D[5], D[4], D[3], D[2], D[1], D[0], such that any of the bits equal to '1' are flipped to '0' and any of the bits equal to '0' are flipped to '1'.

Given the above-noted transformation algorithm, the transform core 112 transforms the 8-bit representation of '−2' (i.e., '1111 1110') as follows. The transform core 112 reorders the bits such that the leftmost bit D[7], which equals '1', is positioned in the location previously occupied by D[4] and such that D[6:4] are each shifted one bit to the left. Based on the reordering, the resulting sequence of bits is '1111 1110'. In accordance with the described techniques, the transform core 112 also flips the other bits of the delta value 202 except for the sign bit, e.g., except for D[7]. By flipping the other bits, the transform core 112 generates the bitstring '0001 0001'. Notably, the leftmost '1' corresponds to the inserted D[7] bit and thus is not flipped. In one or more implementations, the transform core 112 reorders one or more bits of a delta value before flipping the specified bits.

In other implementations, the transform core 112 flips the specified bits before reordering the one or more bits. It is to be appreciated that the bit reordering and flipping is implementable in various ways without departing from the spirit or scope of the described techniques.

In contrast to the bit reordering and flipping performed in connection with negative delta values, the transform core 112 reorders the bits of positive delta values 202 without flipping any bits. When the transform core 112 detects that a delta value is positive, for instance, the transform core 112 reorders the bits of the positive delta value to produce a transformed delta value 204 in a same way as the bits of negative delta values are reordered. For example, the transform core 112, shifts each of bits D[6:4] of positive delta values one location to the left, such that the bit D[6] of a positive delta value 202 is shifted to the leftmost location in the transformed delta value 204, the bit D[5] of the positive delta value 202 is shifted to the second leftmost location in the transformed delta value 204, and so forth. The transform core 112 also inserts the bit D[7] after the bits D[6:4] and keeps the bits D[3:0] in the same locations as in the delta values. Thus, the transform core 112 reorders the bits of a positive delta value 202 from D[7], D[6], D[5], D[4], D[3], D[2], D[1], D[0] to D[6], D[5], D[4], D[7], D[3], D[2], D[1], D[0]. As noted above, the transform core 112 does not flip any bits to produce the transformed delta value 204 for positive delta values in one or more variations.

The illustrated example 500 includes a representation 502 of a first branch of an example transformation algorithm and a representation 504 of a second branch of the transformation algorithm. In this example 500, the representation 502 and the representation 504 represent the branches of the algorithm noted above. In particular, the representation 502 corresponds to the first branch of the algorithm, which is taken when the transform core 112 detects that a delta value is negative, e.g., when D[7] equals '1'. The representation 504 corresponds to the second branch of the algorithm, which is taken when the transform core 112 detects that a delta value is positive, e.g., when D[7] equals '0'.

In this example 500, the blocks 506-520 represent the bits of delta values received by the transform core 112, and the blocks 522-536 represent the transformed delta value 204 produced by the transform core 112 according to the transformation algorithm discussed above. Both the representation 502 of the first branch and the representation 504 depict a same reordering of the bits. In particular, the bits 508-512 are shifted to the leftmost positions 538-542, the bit 506 is inserted into the position 544, and the bits 514-520 are kept in positions 546-552.

Notably, the representation 502 of the first branch indicates that the transform core 112 flips the bits other than the sign bit of the delta value—the transform core 112 flips the bits 508-520. Thus, the transform core 112 flips the bit D[6] to produce D[6]', flips the bit D[5] to produce D[5]', flips the bit D[4] to produce D[4]', flips the bit D[3] to produce D[3]', flips the bit D[2] to produce D[2]', flips the bit D[1] to produce D[1]', and flips the bit D[0] to produce D[0]'. This contrasts with the representation 504 of the second branch, which indicates that the transform core 112 does not flip bits in connection with positive delta values 202. In variations, the transform core 112 transforms the delta values 202 according to different algorithms without departing from the spirit or scope of the described techniques.

In one or more implementations, in addition to transforming the delta values in accordance with the above-discussed algorithm, the transform core 112 also divides each of the transformed delta values 204 from an 8-bit string to two 4-bit strings. For example, the transform core 112, or some other component of the encoder 106 (not shown), divides an 8-bit string representing of the transformed delta value '0001 0001', into a first 4-bit string '0001' and a second 4-bit string '0001'. Recall that this is the transformed delta value 204 of the delta value 202 for '−2'.

By dividing 8-bit strings into two 4-bit strings, the encoder 106 reduces the possible values the Huffman packing core 114 receives for packing. With four bits, for instance, there are only 16 different combinations of 1's and 0's that can be formed. Thus, in one or more implementations, the Huffman packing core 114 receives the transformed delta values 204 as 4-bit strings, such that each bit string received is one of a limited set of bit strings, e.g., one of 16 different bit strings. Based on this, the Huffman packing core 114 packs the transformed delta values 204 using Huffman encoding of a limited set of different symbols, e.g., 16 symbols, one symbol for each possible 4-bit string.

In accordance with the described techniques, the Huffman packing core 114 packs the transformed delta values 204 to generate the compressed data 124 based on a frequency of the symbols, e.g., based on a frequency of the 4-bit strings of the transformed delta values 204. In one or more implementations, the Huffman packing core 114 generates a binary tree of nodes (internal and leaf nodes) according to Huffman encoding principles.

By way of example, the Huffman packing core 114 generates leaf nodes for each of the different symbols, such that the leaf nodes include a respective symbol and a weight, e.g., a frequency with which the respective symbol is observed in the transformed delta values 204. The Huffman packing core 114 identifies the two nodes of the binary tree that correspond to the symbols observed least frequently in the transformed delta values 204 (e.g., having the lowest weights), and the Huffman packing core 114 creates a new internal node of the tree with the two identified nodes as children. The Huffman packing core 114 sets the weight of the new node to the sum of the weight of the children. The Huffman packing core 114 performs the process again on the new internal node and the remaining nodes (e.g., excluding the two leaf nodes). The Huffman packing core 114 repeats this process until only one node remains, which is the root of the Huffman tree.

By encoding the transformed delta values 204 using Huffman coding, the Huffman packing core 114 reduces the search table needed to unpack (i.e., decode) the compressed data 124 from the 256 entries used with delta color compression to just 16 entries, which is a factor of 16. Based on this reduction, the described systems and techniques provide better compression performance than conventional techniques, such as systems that use conventional delta color compression without the discussed transformation or Huffman encoding. By way of example, the better compression performance includes reduced power consumption and a more efficient packing stage of the compression implemented by the encoder 106 relative to conventional techniques.

Thus, the encoder 106 produces the compressed data 124 from the data block 116 by using the delta compression core 110 to perform delta compression on the data block 116, using the transform core 112 to transform the delta values 202 according to a transform algorithm, and using the Huffman packing core 114 to pack the transformed delta values 204 using Huffman coding. In one or more implementations, the encoder 106 operates those cores in the just described order to produce the compressed data 124. To decompress the compressed data 124, though, the decoder 108 operates its cores to perform the decompression stages in reverse order from the compression stages. For example, the decoder 108 operates the Huffman unpacking core 118 to unpack the compressed data 124, the decoder transform core 120 to transform the unpacked data into decompressed delta values, and the delta decompression core 122 to generate a data block 116 from the decompressed delta values.

Figure 6:
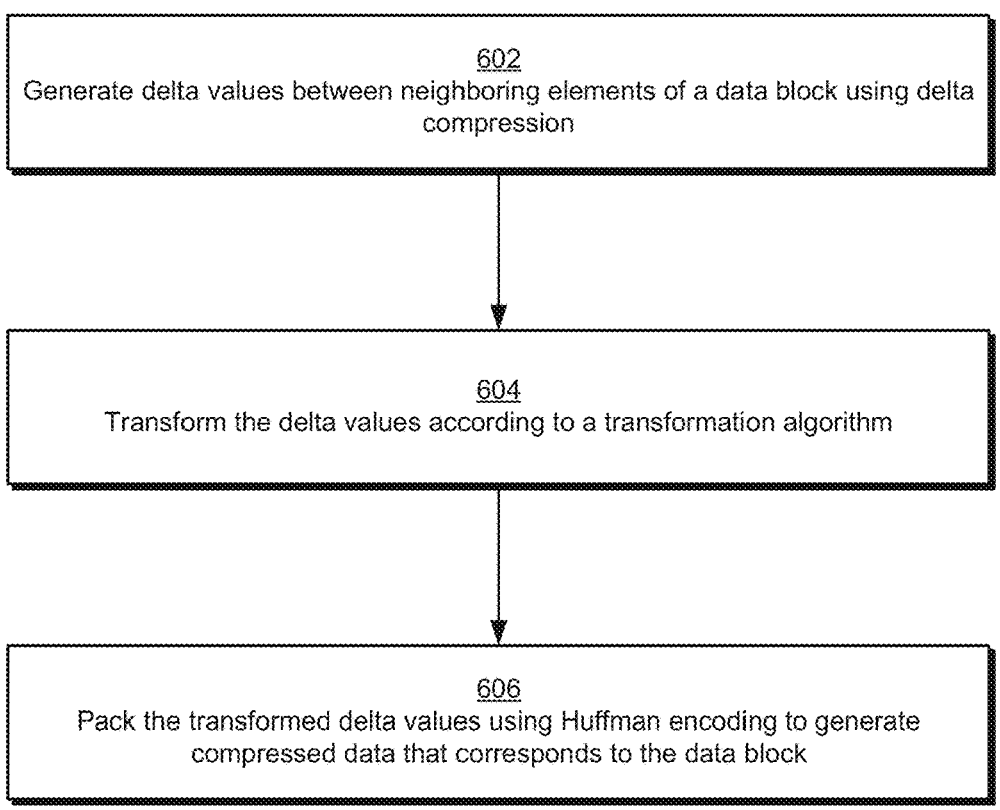
FIG. 6 depicts a procedure in an example implementation of Huffman packing for delta compression.

FIG. 6 depicts a procedure 600 in an example implementation of Huffman packing for delta compression.

Delta values between neighboring elements of a data block are generated using delta compression (block 602). By way of example, the delta compression core 110 generates delta values 202 between neighboring elements of the data block 116 using one or more delta compression techniques. To generate the delta values 202, the delta compression core 110 determines differences between neighboring elements of the data block 116. In an example where the data block 116 is an image, for instance, the delta compression core 110 determines differences between neighboring pixels of the image and generates data corresponding to those differences. This takes advantage of the observation that in images (and various other types of data) differences (i.e., the deltas) between many neighboring elements (e.g., pixels) are often relatively small, as compared to values of the elements themselves. In one or more implementations, the delta compression core 110 determines the delta values 202 using delta color compression, The delta values are transformed according to a transformation algorithm (block 604). By way of example, the transform core 112 transforms the delta values 202 according to a transform algorithm and outputs transformed delta values 204.

The transformed delta values are packed using Huffman encoding to generate compressed data that corresponds to the data block (block 606). By way of example, at a packing stage of the compression, the Huffman packing core 114 packs the transformed delta values 204 using Huffman encoding.

Figure 7:
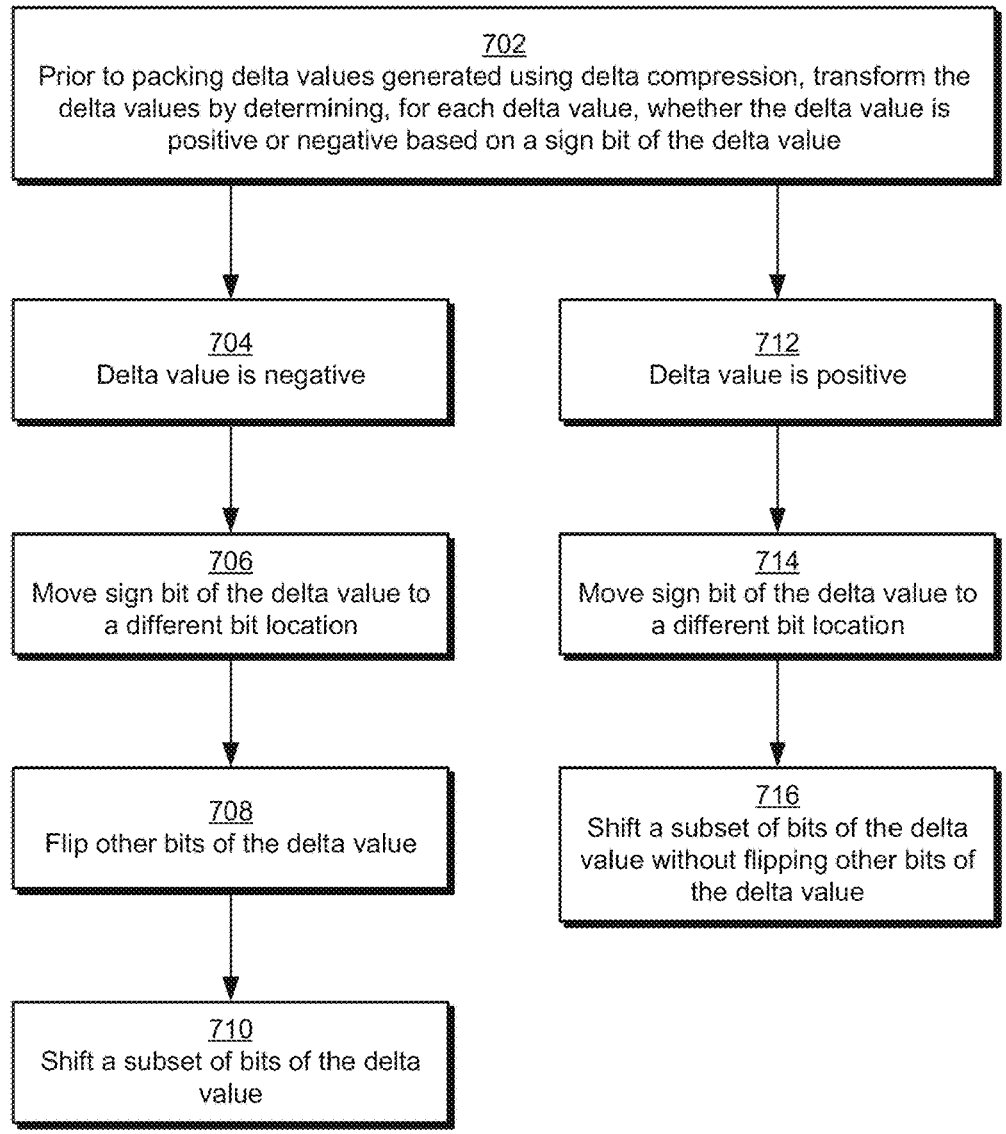
FIG. 7 depicts a procedure in an example implementation of transforming delta values prior to packing.

FIG. 7 depicts a procedure 700 in an example implementation of transforming delta values prior to packing.

Prior to packing delta values generated using delta compression, the delta values are transformed by determining, for each delta value, whether the delta value is positive or negative based on a sign bit of the delta value (block 702). By way of example, the transform core 112 transforms the delta values 202 according to a transform algorithm. In the pseudo code above of the example transformation algorithm, the transform core uses the sign bit to determine whether a delta value 202 is positive or negative. To do so, the transform core 112 initially processes the sign bit, e.g., the leftmost bit, of a delta value 202 to identify whether the delta value is positive or negative.

If it is determined that the delta value is negative (block 704), then the sign bit of the delta value is moved to a different bit location (block 706), other bits of the delta value are flipped (block 708), and a subset of bits of the delta value are shifted (block 710). By way of example, when the sign bit has a value of '1', the transform core 112 determines that the delta value 202 is negative. Responsive to determining that the delta value 202 is negative, the transform core 112 generates a transformed delta value 204 by moving the sign bit of the delta value 202 to a different bit location, flipping other bits of the delta value such that any of the bits equal to '1' are flipped to '0' and any of the bits equal to '0' are flipped to '1', and shifting a subset of bits of the delta value. In the algorithm discussed throughout, for example, the transform core 112 shifts each of bits D[6:4] one location to the left, such that the bit D[6] of the delta value 202 is shifted to the leftmost location in the transformed delta value 204, the bit D[5] of the delta value 202 is shifted to the second leftmost location in the transformed delta value 204, and so forth. Further, the transform core 112 inserts the sign bit D[7] after the bits D[6:4] and keeps the bits D[3:0] in the same locations as in the delta values.

In contrast, if it is determined that the delta value is positive (block 712), then the sign bit of the delta value is moved to a different bit location (block 714) and a subset of bits of the delta value are shifted without flipping other bits of the delta value (block 716). By way of example, when the sign bit has a value of '0', the transform core 112 determines that the delta value 202 is positive. Responsive to determining that the delta value 202 is positive, the transform core 112 then generates a transformed delta value 204 by moving the sign bit of the delta value 202 to a different bit location and shifting a subset of bits of the delta value 202. Notably, unlike the steps which occur when the delta value is negative, the transform core 112 does not flip the other bits of the delta value 202 when the delta value 202 is positive. In the algorithm discussed throughout, for example, the transform core 112 shifts each of bits D[6:4] one location to the left, such that the bit D[6] of the delta value 202 is shifted to the leftmost location in the transformed delta value 204, the bit D[5] of the delta value 202 is shifted to the second leftmost location in the transformed delta value 204, and so forth. Further, the transform core 112 inserts the sign bit D[7] after the bits D[6:4] and keeps the bits D[3:0] in the same locations as in the delta values.

It should be understood that many variations are possible based on the disclosure herein. Although features and elements are described above in particular combinations, each feature or element is usable alone without the other features and elements or in various combinations with or without other features and elements.

The various functional units illustrated in the figures and/or described herein (including, where appropriate, the memory 102, the cache 104, the encoder 106, and the decoder 108) are implemented in any of a variety of different manners such as hardware circuitry, software or firmware executing on a programmable processor, or any combination of two or more of hardware, software, and firmware. The methods provided are implemented in any of a variety of devices, such as a general purpose computer, a processor, or a processor core. Suitable processors include, by way of example, a general purpose processor, a special purpose processor, a conventional processor, a digital signal processor (DSP), a graphics processing unit (GPU), a parallel accelerated processor, a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

In one or more implementations, the methods and procedures provided herein are implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

CONCLUSION

Although the systems and techniques have been described in language specific to structural features and/or methodological acts, it is to be understood that the systems and techniques defined in the appended claims are not necessarily limited to the specific features or acts described. Rather, the specific features and acts are disclosed as example forms of implementing the claimed subject matter.

What is claimed is:

1. A method comprising:
generating delta values between neighboring elements of a data block using delta compression;
transforming the delta values according to a transformation algorithm, including moving a sign bit of a respective delta value to a different bit location of a transformed delta value; and
packing the transformed delta values using Huffman encoding to generate compressed data that corresponds to the data block.

2. The method of claim 1, wherein each of the delta values represents a difference between neighboring elements of the data block.

3. The method of claim 1, wherein transforming the delta values is further based on whether a respective delta value is positive or negative.

4. The method of claim 1, wherein the sign bit indicates whether the respective delta value is positive or negative.

5. The method of claim 1, wherein the sign bit is positioned at a leftmost bit location of the respective delta value, and wherein transforming the respective delta value moves the sign bit from the leftmost bit location to the different bit location of the transformed delta value.

6. The method of claim 1, wherein transforming the delta values shifts at least a subset of bits of the respective delta value of a transformed delta value.

7. The method of claim 1, wherein transforming the delta values flips bits other than the sign bit of the respective delta value if the respective delta value is negative.

8. The method of claim 1, wherein each of the delta values is an 8-bit string, and wherein transforming the delta values divides the 8-bit string of each of the delta values into two 4-bit strings.

9. The method of claim 8, wherein packing the transformed delta values using Huffman encoding is based on a frequency of the 4-bit strings of the transformed delta values.

10. A method comprising:
generating delta values between neighboring elements of a data block using delta compression; and
prior to packing the delta values transforming the delta values by:
determining, for each delta value, whether the delta value is positive or negative based on a sign bit of the delta value;
if the delta value is negative, moving the sign bit of the delta value to a different bit location, flipping other bits of the delta value, and shifting a subset of the bits of the delta value; or
if the delta value is positive, moving the sign bit of the delta value to the different bit location and shifting the subset of the bits of the delta value without flipping the other bits of the delta value.

11. The method of claim 10, further comprising packing the transformed delta values using Huffman encoding to generate compressed data that corresponds to the data block.

12. The method of claim 10, wherein the delta compression comprises delta color compression.

13. The method of claim 10, wherein each of the delta values are 8 bits and include a bit 0 location, a bit 1 location, a bit 2 location, a bit 3 location, a bit 4 location, a bit 5 location, a bit 6 location, a bit 7 location, and wherein the sign bit is positioned at the bit 7 location, and wherein transforming the delta values comprises moving the sign bit of each of the delta values from the bit 7 location to the bit 4 location.

14. The method of claim 13, wherein shifting the subset of the bits of the delta value comprises shifting the bit 4 location, the bit 5 location, and the bit 6 location to the bit 5 location, the bit 6 location, and the bit 7 location, respectively.

15. A system comprising:
at least one processor configured to:
generate delta values between neighboring elements of a data block;
transform the delta values by moving a sign bit of each of the delta values to a different bit location of a transformed delta value; and
pack the transformed delta values using Huffman encoding to generate compressed data that corresponds to the data block; and
a memory configured to store the delta values, the transformed delta values, and the compressed data.

16. The system of claim 15, further comprising a decoder to decompress the compressed data.

17. The system of claim 15, wherein each of the delta values represents a difference between neighboring elements of the data block.

18. The system of claim 15, wherein the at least one processor is further configured to transform each of the delta values based on the sign bit of the delta value and the sign bit of the delta value indicates whether the delta value is positive or negative.

19. The system of claim 15, wherein each of the delta values is an 8-bit string, and wherein the at least one processor is further configured to divide the 8-bit string of each of the delta values into two 4-bit strings.

20. The system of claim 19, wherein the at least one processor is further configured to encode each of the 4-bit strings with a symbol from a limited set of symbols, wherein the symbol is selected based on a frequency of the 4-bit strings of the transformed delta values.

* * * * *